(12) United States Patent
Jacobson et al.

(10) Patent No.: US 9,730,366 B2
(45) Date of Patent: Aug. 8, 2017

(54) ELECTROMAGNETIC INTERFERENCE SUPPRESSING SHIELD

(71) Applicant: Raytheon Company, Waltham, MA (US)

(72) Inventors: Boris S. Jacobson, Westford, MA (US); Stephen R. Elkins, Franklin, MA (US); Bradley S. Jaworski, Bedford, MA (US)

(73) Assignee: Raytheon Company, Waltham, MA (US)

( * ) Notice: Subject to any disclaimer, the term of this patent is extended or adjusted under 35 U.S.C. 154(b) by 109 days.

(21) Appl. No.: 14/618,763

(22) Filed: Feb. 10, 2015

(65) Prior Publication Data

US 2016/0234980 A1    Aug. 11, 2016

(51) Int. Cl.
*H05K 9/00*        (2006.01)
(52) U.S. Cl.
CPC ................................. *H05K 9/0045* (2013.01)
(58) Field of Classification Search
CPC .... G06F 1/182; H05K 9/0016; H05K 9/0062; H05K 9/0032; H05K 9/0039; H05K 1/0218
USPC ................................................ 361/816, 818
See application file for complete search history.

(56) References Cited

U.S. PATENT DOCUMENTS

| | | | |
|---|---|---|---|
| 3,043,000 A | 7/1962 | Hatfield et al. | |
| 4,268,957 A | 5/1981 | Sbuelz | |
| 4,623,771 A | 11/1986 | Sakino | |
| 4,678,986 A | 7/1987 | Barthelemy | |
| 4,814,963 A | 3/1989 | Petersen | |
| 5,434,770 A | 7/1995 | Dreifuerst et al. | |
| 5,517,755 A | 5/1996 | Wright | |
| 5,545,966 A | 8/1996 | Ramos et al. | |
| 5,625,545 A | 4/1997 | Hammond | |
| 5,808,535 A | 9/1998 | DeLucia | |
| 5,864,475 A | 1/1999 | Ikawa et al. | |
| 5,933,339 A | 8/1999 | Duba | |
| 5,986,909 A | 11/1999 | Hammond | |
| 6,218,792 B1 | 4/2001 | Berth et al. | |
| 6,236,580 B1 | 5/2001 | Aiello et al. | |
| 6,384,703 B1 | 5/2002 | Ramos et al. | |

(Continued)

FOREIGN PATENT DOCUMENTS

KR        10-1198031 B1    11/2012
WO    WO 2013/061799 A1     5/2013

OTHER PUBLICATIONS

Giri et al, "Common-Duty-Ratio Control of Input-Series Connected Modular DC-DC Converters with Active Input Voltage and Load-Current Sharing", IEEE Transactions on Industry Applications, vol. 42, No. 4, Jul./Aug. 2006.

(Continued)

*Primary Examiner* — Hung S Bui (57) ABSTRACT

An electromagnetic interference (EMI) suppressing shield is disclosed. The EMI suppressing shield can include a plurality of shield portions electrically coupled to a positive electric potential polarity or a negative electric potential polarity. At least some of the plurality of shield portions can be electrically isolated from one another. At least one of the plurality of shield portions can be electrically coupled to the positive electric potential and at least one of the plurality of shield portions can be electrically coupled to the negative electric potential.

23 Claims, 10 Drawing Sheets

(56) References Cited

U.S. PATENT DOCUMENTS

| | | | |
|---|---|---|---|
| 6,661,134 B2 * | 12/2003 | Sunaga | H02K 11/33 310/64 |
| 6,885,268 B2 | 4/2005 | Choi | |
| 6,940,715 B2 | 9/2005 | Beihoff et al. | |
| 7,002,443 B2 | 2/2006 | Ness et al. | |
| 7,142,085 B2 | 11/2006 | Phadke | |
| 7,489,226 B1 | 2/2009 | Chignola et al. | |
| 8,009,004 B2 | 8/2011 | Ahangar et al. | |
| 8,064,198 B2 | 11/2011 | Higashidani et al. | |
| 8,383,939 B2 | 2/2013 | Gotou | |
| 8,686,288 B2 | 4/2014 | Kalayjian et al. | |
| 9,048,721 B2 * | 6/2015 | Abe | H02M 7/003 |
| 2003/0133268 A1 | 7/2003 | Radosevich et al. | |
| 2005/0068147 A1 | 3/2005 | Skibinski | |
| 2008/0174926 A1 | 7/2008 | Evans et al. | |
| 2010/0025126 A1 | 2/2010 | Nakatsu | |
| 2010/0308939 A1 | 12/2010 | Kurs | |
| 2011/0096496 A1 | 4/2011 | Doo et al. | |
| 2014/0126154 A1 | 5/2014 | Higuchi | |
| 2014/0132380 A1 | 5/2014 | Jacobson | |
| 2014/0168900 A1 | 6/2014 | Korich | |
| 2015/0015356 A1 | 1/2015 | Jacobson et al. | |
| 2015/0163962 A1 | 6/2015 | Suzuki | |

OTHER PUBLICATIONS

Prasai, "Utilizing stray capacitances of a Litz wire", Proc. Inst. Elect. Eng., 2005.

Skutt et al, "Leakage Inductance and Termination Effects in a High-Power Planar Magnetic Structure", IEEE PESC, 1994.

Sullivan, "Optimal Choice for Number of Strands in a Litz-Wire Transformer Winding", IEEE Transactions on Power Electronics, 1999, vol. 14, No. 2, pp. 283-291.

Tang et al, "Stranded Wire With Uninsulated Strands as a Low-Cost Alternative to Litz Wire" PESC Jun. 2003, pp. 289-295.

* cited by examiner

ELECTROMAGNETIC INTERFERENCE SUPPRESSING SHIELD

BACKGROUND

High power magnetics assemblies are often used in galvanically-isolated power converters for medium voltage and high voltage applications, such as energy storage modules, micro-grids, power supplies, and AC/DC converters. Conventionally, such assemblies comprise a number of individual magnetic components or devices wired together. Such magnetic components and interconnects generate electromagnetic interference (EMI), which is typically shielded to minimize negative effects on other electrical components.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

The design and manufacture of magnetic devices can present a number of challenges, particularly for those magnetic devices operating at high voltage in a power range of tens of kilowatts, a current range of hundreds of amperes, and a frequency range of tens of kilohertz. For example, some disadvantages of the current approach include susceptibility to corona inception for components at high voltage potential and difficulty of suppressing EMI generated by magnetic components and interconnects.

Accordingly, an electromagnetic interference (EMI) suppressing shield is disclosed that effectively suppresses EMI generated by magnetic components and interconnects and reduces the probability of corona inception. The EMI suppressing shield can include a plurality of shield portions electrically coupled to a positive electric potential polarity or a negative electric potential polarity. In one example, at least some of the plurality of shield portions can be electrically isolated from one another. In another example, at least one of the plurality of shield portions can be electrically coupled to the positive electric potential and at least one of the plurality of shield portions can be electrically coupled to the negative electric potential.

In one aspect, an EMI suppressing shield system is disclosed. The system can include a first shield having a plurality of first shield portions electrically coupled to a positive electric potential polarity or a negative electric potential polarity. At least some of the plurality of first shield portions can be electrically isolated from one another. At least one of the plurality of first shield portions can be electrically coupled to the positive electric potential and at least one of the plurality of first shield portions can be electrically coupled to the negative electric potential. The system can also include a second shield electrically coupled to ground.

Figure 1:
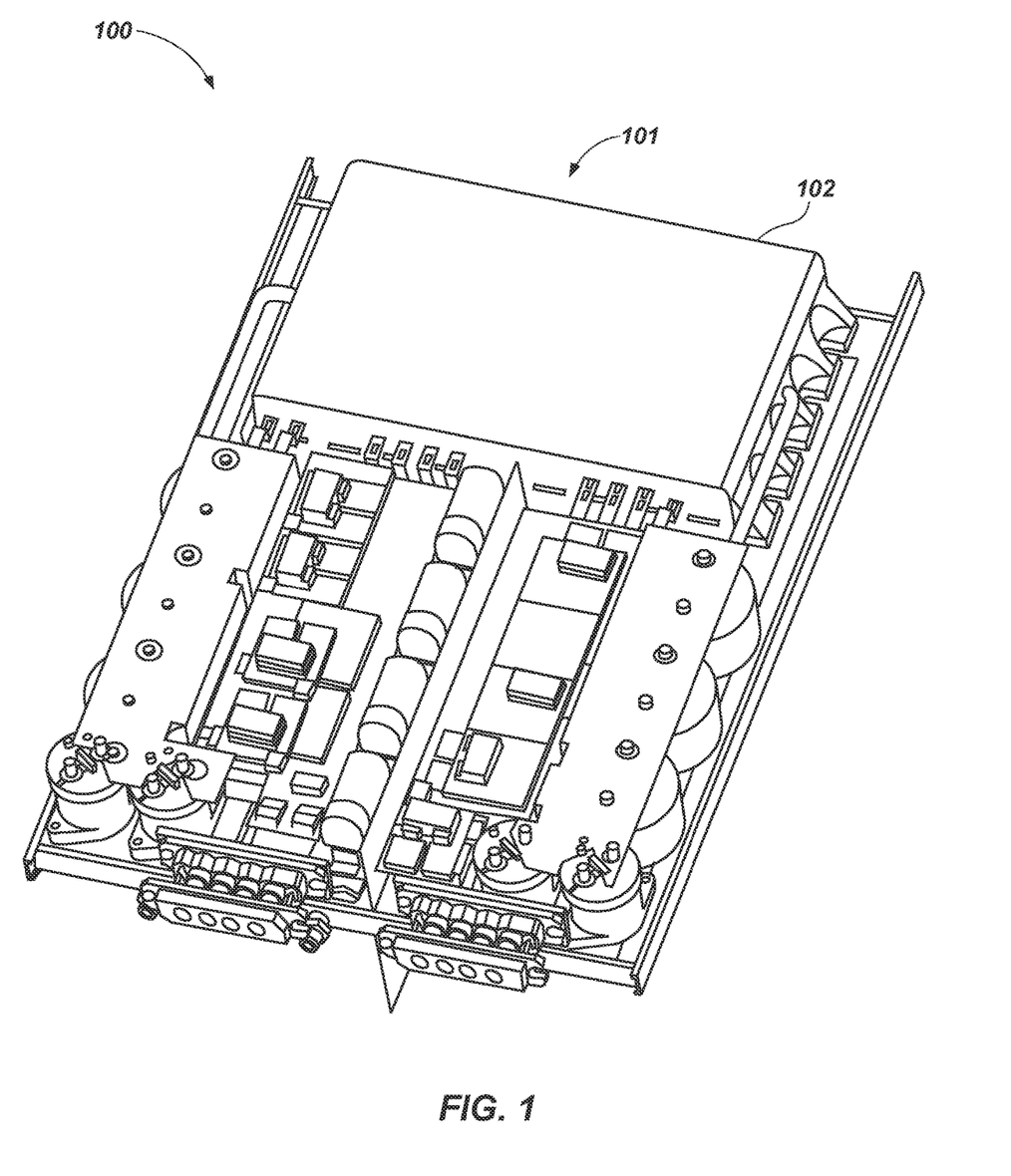
FIG. 1 is an illustration of an electronic device that can incorporate an EMI suppressing shield in accordance with an example of the present disclosure.

FIG. 1 illustrates an example of an electronic device 100, which can include aspects of an electromagnetic interference (EMI) suppressing shield as disclosed herein. In general, the electronic device 100 can include a noise source or a source of electromagnetic interference. In one non-limiting example used for illustration purposes, the electronic device 100 can be a power converter module with a power converter magnetics assembly 101, which can include any type or quantity of independent magnetic devices, such as transformers, resonant inductors, and/or current transformers within an enclosure 102 that can generate noise or electromagnetic interference. Aspects of an electromagnetic interference (EMI) suppressing shield or shield system discussed hereinafter can be integrated with, disposed within, and/or disposed about such an enclosure.

Figure 2:
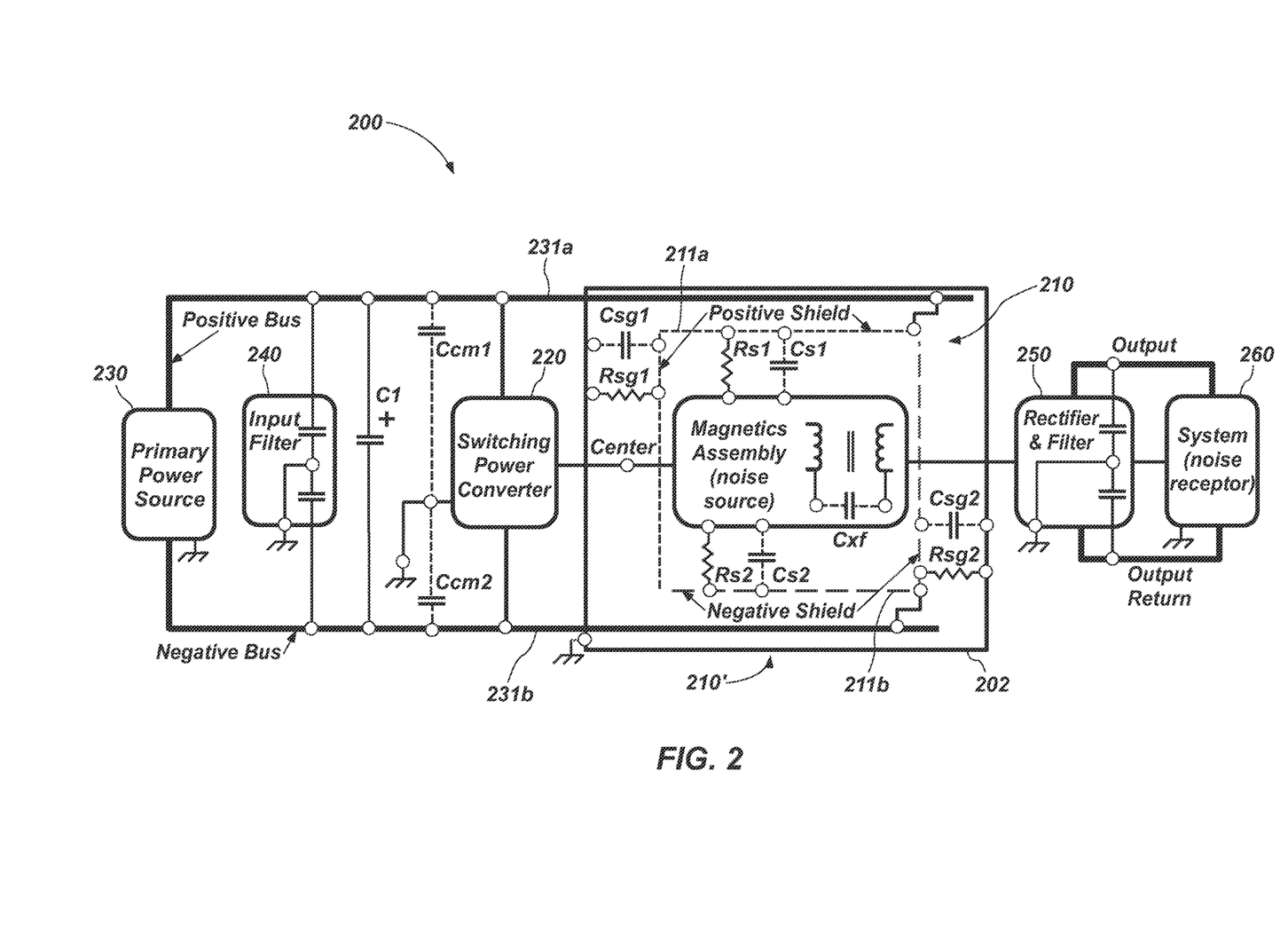
FIG. 2 is a schematic of a circuit for a magnetics assembly that can be incorporated in the electronic device of FIG. 1.

FIG. 2 shows a schematic of a simplified equivalent circuit for a magnetics assembly 201 as a part of a power converter module 200, which illustrates aspects of an EMI suppressing shield 210 or shield system in accordance with an example of the present disclosure. In one aspect, shown in the schematic, the power converter module 200 can include a power converter 220 connected to a primary power source 230 balanced with respect to ground (i.e., the voltage at a positive bus 231a equals the voltage at a negative bus 231b). As used herein, the term "ground" means the electrically conductive parts of the converter module or its subassembly enclosure that have a direct electrical connection to the earth. The power converter module 200 also includes an input filter 240, an output rectifier and filter 250, and a system (noise receptor) 260. The shield 210 is configured to shield the magnetics assembly 201. The shield 210 includes multiple shield portions 211a, 211b electrically isolated from one another and electrically coupled to a positive electric potential polarity or a negative electric potential polarity. For example, as shown in FIG. 2, the magnetics assembly 201 can have a shield 210 with two general shield portions: (a) a positive shield portion 211a referenced to the positive bus and (b) a negative shield portion 211b referenced to the negative bus. Each of these general positive and negative shield portions 211a, 211b can be subdivided into multiple portions, as described further below. In one aspect, the magnetics assembly 201 (i.e., noise source) can be disposed within the shield 210. Major parasitic components include shield portions 211a, 211b to enclosure capacitors and leakage resistors Csg1, Csg2, Rsg1, and Rsg2, as well as the magnetics assembly 201 to shield portions 211a, 211b capacitors and leakage resistors Cs1, Cs2, Rs1, and Rs2.

Connecting the shield portions 211a, 211b of the shield 210 to different terminals of the prime power source 230 (i.e., different high voltage potentials) can bias the shield portions 211a, 211b to create a dipole, instead of only a single potential, which can reduce propagation of common-mode currents to the ground and reduce or minimize the probability of corona inception for components at high voltage AC potential. This shield design can maintain voltage symmetry with respect to ground (i.e. a chassis or an outer enclosure 202 of the magnetics assembly) and can provide suppression of the radiated electric field component of EMI while reducing voltage gradients and the associated shield-to-enclosure voltage stress in the magnetics assembly 201. The shield 210 can also reduce coupling of capacitive currents to ground when electrostatically shielding components with large surface area with fast-changing voltages (e.g. magnetic cores). In addition, a second shield (identified by reference number 210', which can be incorporated with the outer enclosure 202 of the magnetics assembly 201) can be disposed about the first shield 210 and connected to the ground potential, which can reduce DC bias voltage generated on the magnetics assembly 201 in the event of converter ground faults. In one aspect, a secondary power source (not shown), with a positive bus and a negative bus, can also be included to provide power to components of the magnetics assembly 201. If the primary or the secondary power source is referenced to ground, the double shield configuration can reduce DC bias voltage generated on the magnetics assembly 201 in the event of converter ground fault.

Figure 3:
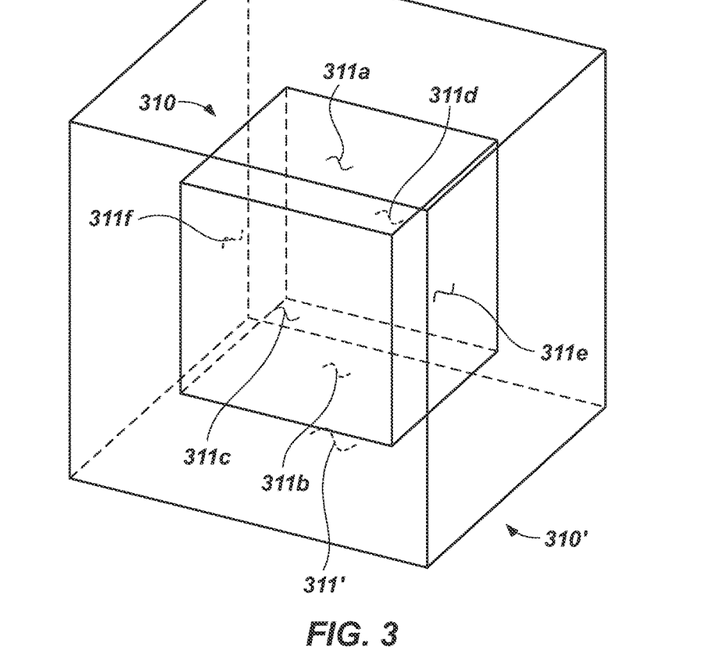
FIG. 3 is a schematic illustration of an EMI suppressing shield in accordance with an example of the present disclosure.

FIG. 3 is a schematic illustration of an EMI suppressing shield 310 in accordance with an example of the present disclosure, which can be utilized in the magnetics assembly circuit of FIG. 2. In general, the shield 310 can include a plurality of shield portions 311a-f. At least some of the plurality of shield portions 311a-f can be electrically isolated from one another. In one aspect, all of the plurality of shield portions 311a-f can be electrically isolated from one another. The shield portions can comprise a conductive material and/or a semi-conductive material. Each of the plurality of shield portions 311a-f can be electrically coupled to a positive electric potential polarity or a negative electric potential polarity, such that at least one of the shield portions is electrically coupled to the positive electric potential and at least one of the shield portions is electrically coupled to the negative electric potential. In one aspect, at least two of the shield portions 311a-f can be electrically coupled to electric potentials having the same polarity. For example, shield portions 311a, 311c, 311e can be electrically coupled to a negative electric potential and shield portions 311b, 311d, 311f can be electrically coupled to a positive electric potential. Other combinations or scenarios are possible. In one aspect, each of the positive and negative electric potential polarities can include multiple electric potentials, such as may be provided by different power buses (i.e., a primary bus and a secondary bus).

The shield portions 311a-f can be arranged in any suitable configuration to provide effective shielding in accordance with the principles disclosed herein. For example, the shield portions 311a-f can be configured as a polyhedron, such as a hexahedron as illustrated in the figure, to effectively surround or enclose a noise source. In one aspect, the shield portions 311a-f can be configured such that each of the shield portions 311a-f comprises at least a portion of a face of the polyhedron. In another aspect, each of the shield portions 311a-f can correspond to a face of the polyhedron. Although the shield portions 311a-f are shown illustrated as planar faces of a polyhedron, it should be recognized that the shield portions 311a-f can be of any suitable configuration, both collectively and individually, such as having some degree of curvature.

In one aspect, one shield portion can be electrically coupled to a positive electric potential polarity and can correspond to one face of the polyhedron and another shield portion can be electrically coupled to a negative electric potential polarity and can correspond to another face of the polyhedron. In a particular aspect, these faces of the polyhedron can be opposite one another. For example, shield portions 311a, 311c, 311e corresponding to different faces of the polyhedron are shown electrically coupled to a negative electric potential and shield portions 311b, 311d, 311f corresponding to different faces of the polyhedron are shown electrically coupled to a positive electric potential. In addition, shield portions 311a-311b, shield portions 311c-311d, and shield portions 311e-311f are electrically coupled to opposite electrical potential polarities and correspond to opposite faces of the polyhedron.

In another aspect, at least two of the shield portions 311a-f can be electrically coupled to one electric potential polarity and can correspond to adjacent faces of the polyhedron and at least two other shield portions can be electrically coupled to the other electric potential polarity and can correspond to adjacent faces of the polyhedron. For example, shield portions 311a, 311c, 311e corresponding to adjacent faces of the polyhedron are electrically coupled to a negative electric potential, and shield portions 311*b*, 311*d*, 311*f* corresponding to adjacent faces of the polyhedron are electrically coupled to a positive electric potential. Thus, in the example illustrated, the "box-shaped" polyhedron configuration has six faces with six shield portions arranged in pairs with opposite polarity, such that three adjacent shield portions 311*a*, 311*c*, 311*e* that are connected to a negative electric potential polarity "face" three adjacent shield portions 311*b*, 311*d*, 311*f* that are connected to a positive electric potential polarity, thus forming a six-plate capacitor. This shield design maintains voltage symmetry with respect to ground (i.e. an outer enclosure of the magnetics assembly) and reduces shield-to-enclosure voltage stress. The shielding arrangement can also include a shield 310' (i.e., a face of an outer enclosure) that can be connected to the ground potential, such as shield 210' illustrated schematically in FIG. 2. As indicated, other shield configurations are possible and contemplated herein. Therefore, the examples and illustrations shown herein are not to be construed as limiting in any way.

Figure 4:
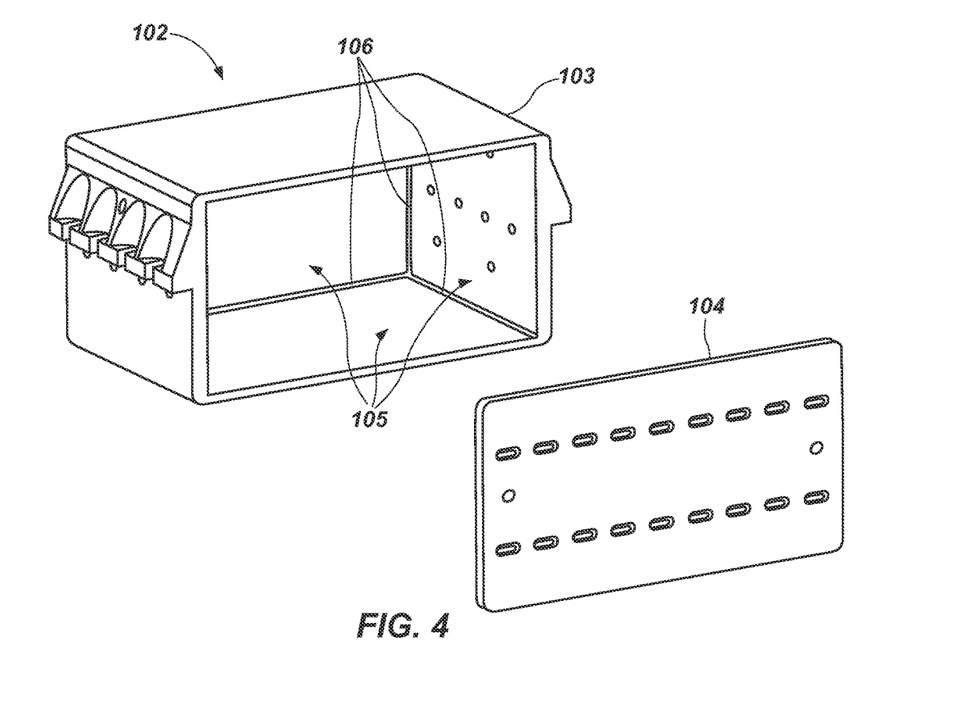
FIG. 4 is an illustration of an EMI suppressing shield as in FIG. 3 incorporated in an enclosure in accordance with an example of the present disclosure.

A shield in accordance with the principles discussed above with respect to FIG. 3 can be implemented in the enclosure 102 of FIG. 1, as illustrated in FIG. 4. The enclosure 102 can be constructed in any suitable manner. As shown, the enclosure 102 includes a chassis 103 and a cover 104. The structural portion of the chassis 103 and/or the cover 104 can be constructed of an electrical insulating material, such as a polymer. As illustrated, the interior sides or faces 105 of the chassis 103 and the cover 104 (hidden from view) can be covered in an electrically conductive and/or semi-conductive material so that the enclosure 102 can act as a shield, as described above with reference to FIG. 3. For example, the interior faces 105 of the chassis 103 and cover 104 can be metalized by any suitable process (e.g., plating, painting, vapor deposition, foil, etc.) to provide an electrically conductive material on the interior faces of the enclosure 102. Boundaries 106 of the interior faces 105 of the chassis 103 can be covered by a masking material to electrically isolate the faces 105 from one another. When assembled, the chassis 103 and the cover 104 can be separated by an electrical insulating component, such as a gasket. The result is a shield having six shield portions that can be coupled to positive and negative electrical potentials, such as described above with reference to FIG. 3.

Figure 5:
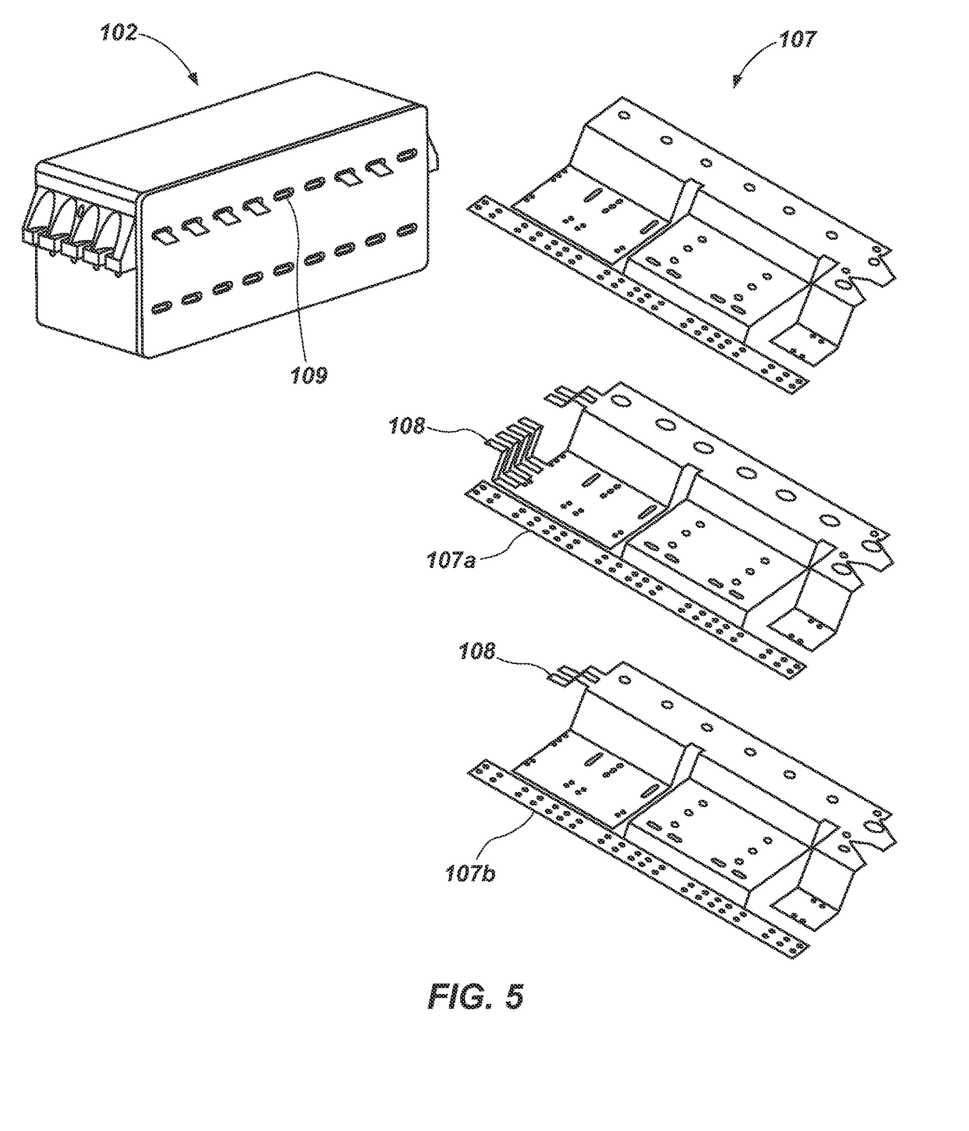
FIG. 5 is an illustration of an enclosure and a bus bar integrated with the enclosure to form an EMI suppressing shield in accordance with an example of the present disclosure.

FIG. 5 illustrates the enclosure 102 of FIG. 1 and a bus bar 107 for providing power to components of the magnetic assembly. The bus bar 107 can be integrated with the enclosure 102 to form an EMI suppressing shield, shown isolated for clarity. In one aspect, shielding of the enclosure 102 can be implemented utilizing the bus bar 107 such that the bus bar 107 is integrated with the enclosure to form at least a portion of an EMI suppressing shield as disclosed herein. For example, the bus bar 107 can be attached to the components of the magnetics assembly to provide power for the magnetics assembly. A positive bus or plane 107*a* and a negative bus or plane 107*b* of the bus bar 107 can be located on different layers inside the bus structure. Fingers 108 of the bus bar 107 can extend into the enclosure 102, such as via one or more openings 109, and can couple with shield portions as described herein to implement a multi-portion shielding design in accordance with the present disclosure. In one aspect, the bus bar 107 can extend into the enclosure 102 to cover one or more of the inner surfaces or faces of the enclosure 102, thus forming the shield portions. In the example illustrated, the bus bar 107 comprises multiple (three) components. However, the bus bar 107 can be comprised of any number of components, and can be of any suitable configuration.

Figure 6:
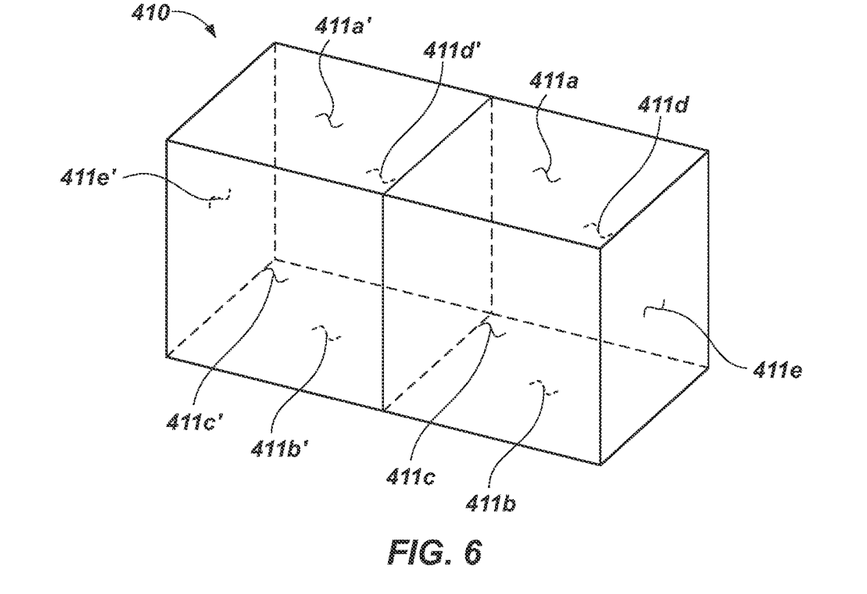
FIG. 6 is a schematic illustration of an EMI suppressing shield in accordance with another example of the present disclosure.

FIG. 6 is a schematic illustration of an EMI suppressing shield 410 in accordance with another example of the present disclosure. The shield 410 is similar in many respects to the shield 310 discussed above. For example, as with the shield 310, the shield 410 can include a plurality of shield portions 411*a-e*, 411*a'-e'*. At least some of the plurality of shield portions 411*a-e*, 411*a'-e'* can be electrically isolated from one another. In one aspect, all of the plurality of shield portions 411*a-e*, 411*a'-e'* can be electrically isolated from one another. As shown in the figure, at least two of the shield portions 411*a-e*, 411*a'-e'* are associated with a single face of a polyhedron. For example, shield portions 411*a*-411*a'*, shield portions 411*b*-411*b'*, shield portions 411*c*-411*c'*, and shield portions 411*d*-411*d'* share a common face of the polyhedron. In one aspect, these shield portions sharing a common face of the polyhedron can be electrically coupled to electric potentials having the same polarity, as illustrated in the figure. In another aspect, the shield portions 411*a-e*, 411*a'-e'* can comprise a primary group of shield portions 411*a-e* and a secondary group of shield portions 411*a'-e'*. Thus, although shield portions sharing a common face of the polyhedron may be electrically coupled to electric potentials having the same polarity, these neighboring shield portions can be at different electric potentials.

In one aspect, a primary power source and a secondary power source, each with a positive bus and a negative bus, can be included to provide power to components of the magnetics assembly. Unlike the scenario above in FIG. 2, if neither the primary nor the secondary power source is referenced to ground, (i.e., both are "floating" with respect to ground), then two separate shields or shield groups can be introduced: a primary shield or group (411*a-e*) and a secondary shield or group (411*a'-e'*). Thus, at least one shield portion 411*a-e* of the primary group can be electrically coupled to a first positive electric potential polarity, and at least one other shield portion 411*a-e* of the primary group can be electrically coupled to a first negative electric potential polarity. Similarly, at least one other shield portion 411*a'-e'* of the secondary group can be electrically coupled to a second negative electric potential polarity, and at least one other shield portion 411*a'-e'* of the secondary group can be electrically coupled to a second negative electric potential polarity. The five shield portions 411*a-e* of the primary group and the five shield portions 411*a'-e'* of the secondary group can therefore be connected to stable electrical potentials. Thus, although the shield portions 411*a*-411*a'*, shield portions 411*b*-411*b'*, shield portions 411*c*-411*c'*, and shield portions 411*d*-411*d'* share a common face of the polyhedron and are electrically coupled to electric potentials having the same polarity, the electric potentials of the same polarity can be different electric potentials. Electrical connections to the positive electrical potentials and the negative electric potentials can be arranged to minimize potential difference between primary and secondary surfaces, i.e. the adjacent surfaces are connected to signals of same polarity. The resultant lower voltage gradient can reduce the probability of corona inception. This arrangement can also produce lower EMI and coupling of capacitive currents from primary to secondary and to the ground.

Figure 7:
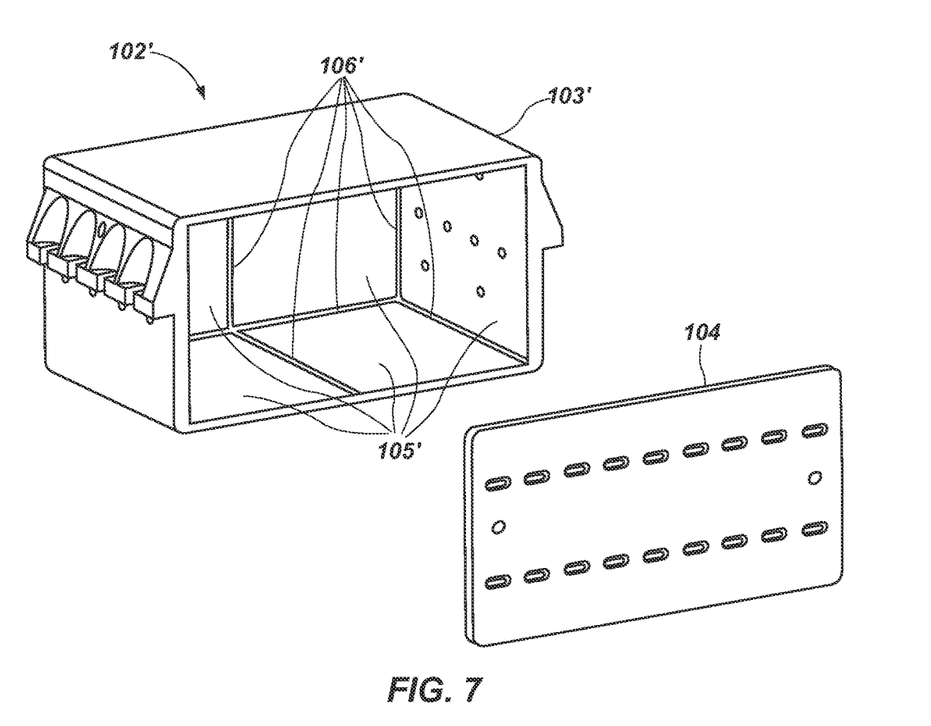
FIG. 7 is an illustration of an EMI suppressing shield as in FIG. 6 incorporated in an enclosure in accordance with an example of the present disclosure.
Figure 8A:
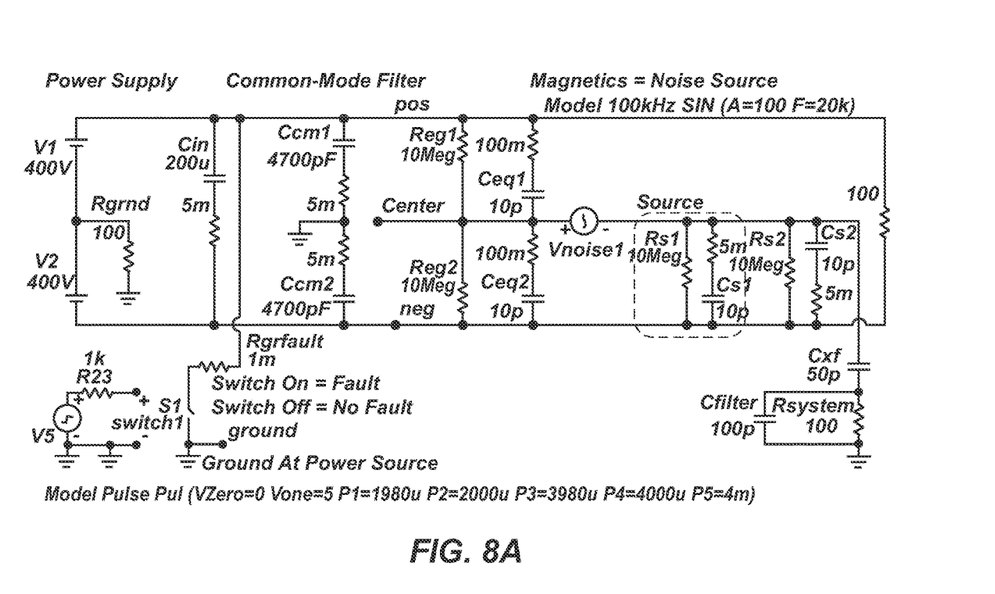
FIG. 8A illustrates a simulation model of a conventional shielding configuration.
Figure 8B:
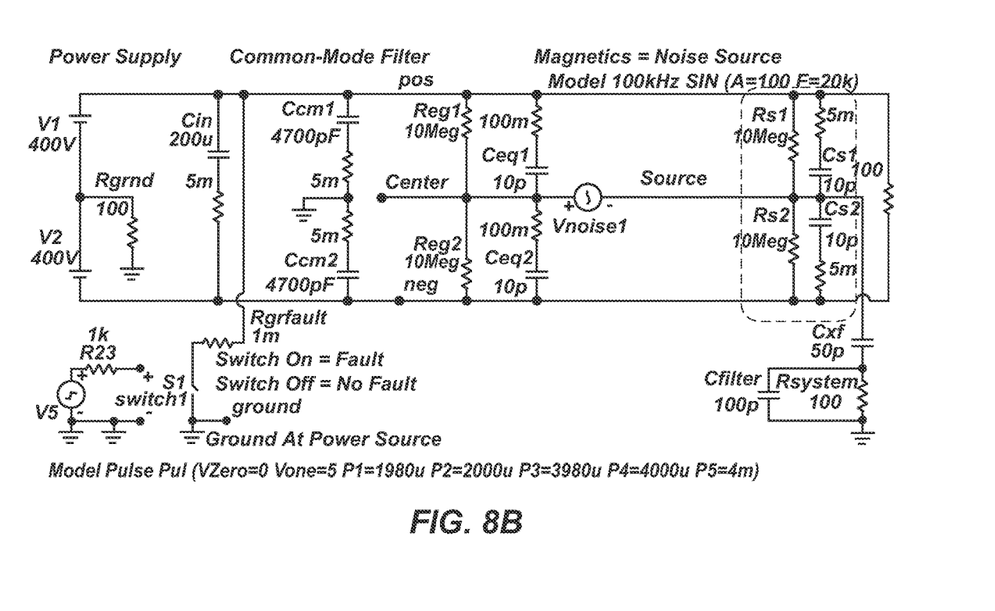
FIG. 8B illustrates a simulation model of an EMI suppressing shielding configuration in accordance with an example of the present disclosure.
Figure 9A:
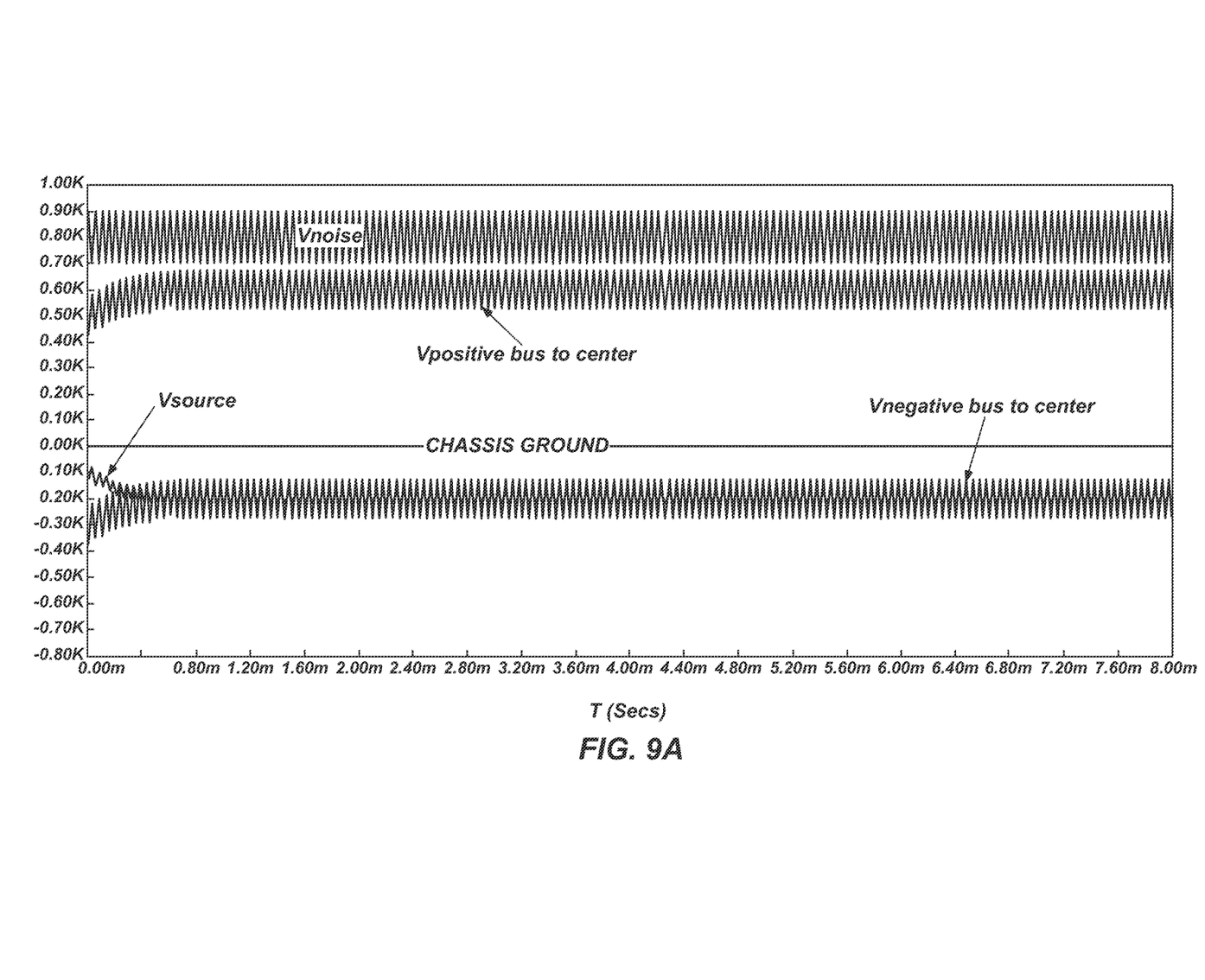
FIG. 9A illustrates results of the conventional shielding simulation model of FIG. 8A under normal conditions.
Figure 9B:
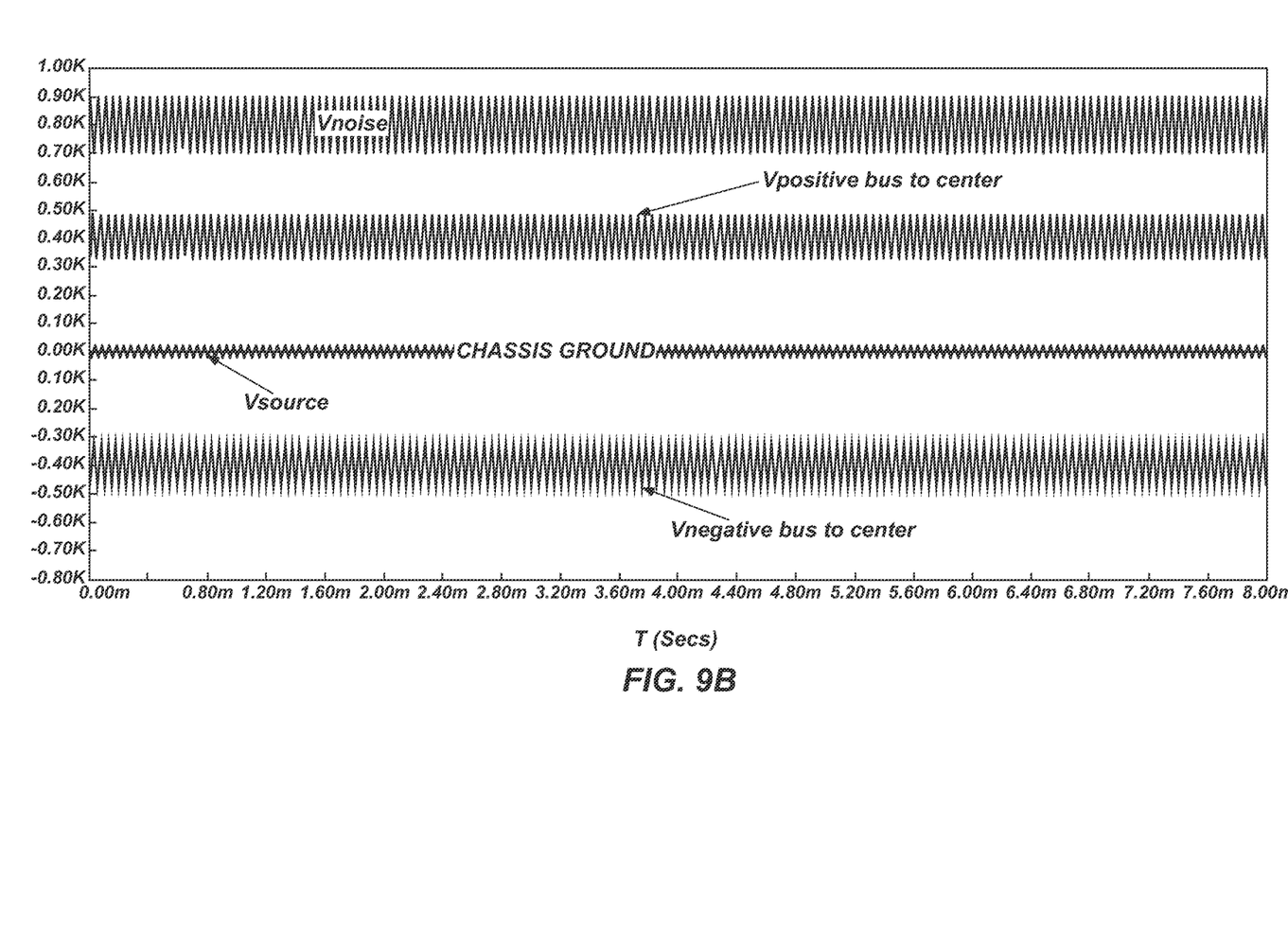
FIG. 9B illustrates results of the EMI suppressing shield simulation model in accordance with an example of the present disclosure of FIG. 8B under normal conditions.
Figure 10A:
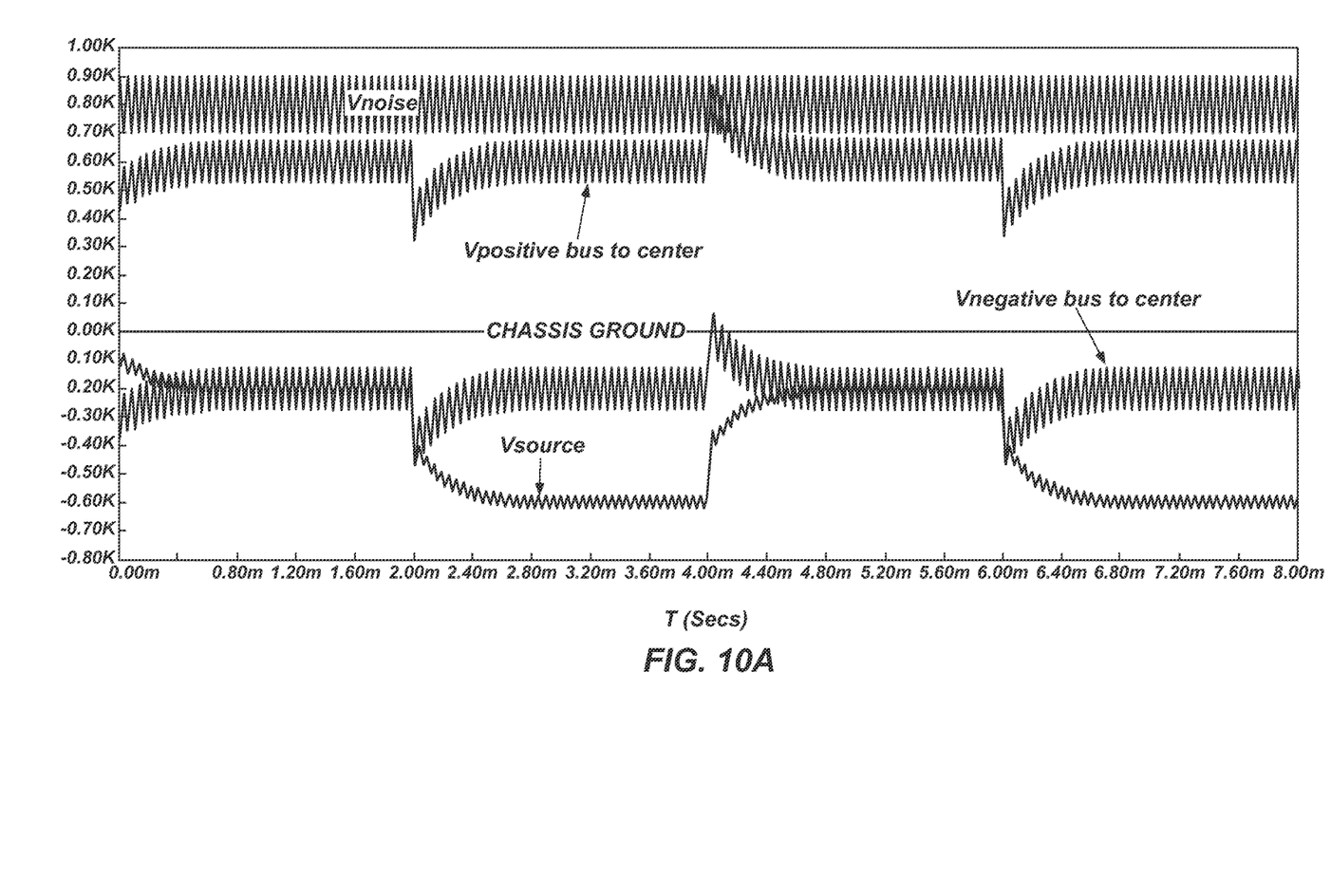
FIG. 10A illustrates results of the conventional shielding simulation model of FIG. 8A under ground fault conditions.
Figure 10B:
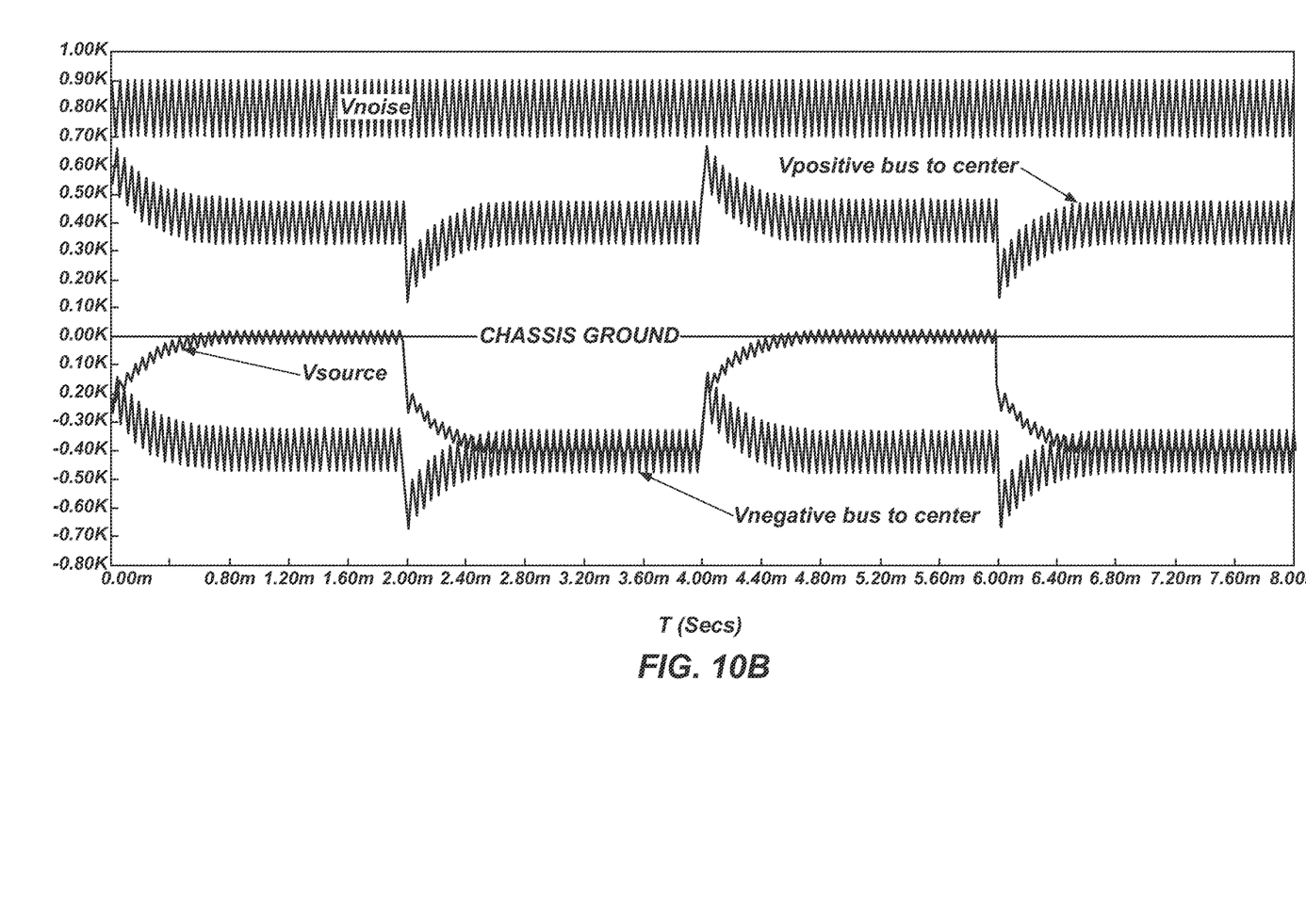
FIG. 10B illustrates results of the EMI suppressing shield simulation model in accordance with an example of the present disclosure of FIG. 8B under ground fault conditions.

A shield in accordance with the principles discussed above with respect to FIG. 6 can be implemented in an enclosure 102' as illustrated in FIG. 7. Such an enclosure 102' may be utilized in the electronic device 100 of FIG. 1. The enclosure 102' can be constructed in any suitable manner. As shown, the enclosure 102' includes a chassis 103' and a cover 104'. The structural portion of the chassis 103' and/or the cover 104' can be constructed of an electrical insulating material, such as a polymer. As illustrated, the interior sides or faces 105' of the chassis 103' and the cover 104' (hidden from view) can be covered in an electrically conductive and/or semi-conductive material so that the enclosure 102' can act as a shield, as described above with reference to FIG. 6. For example, the interior faces 105' of the chassis 103' and cover 104' can be metalized by any suitable process (e.g., plating, painting, vapor deposition, etc.) to provide an electrically conductive material on the interior faces of the enclosure 102'. Boundaries 106' of the interior faces 105' of the chassis 103' can be covered by a masking material to electrically isolate the faces 105' from one another. In addition, the chassis 103' and the cover 104' can be divided in two portions by masking material to form a primary shield or group of shield portions and a secondary shield or group of shield portions, as discussed above. When assembled, the chassis 103' and the cover 104' can be separated by an electrical insulating component, such as a gasket. The result is a shield having a primary group of five shield portions and a secondary group of five shield portions that can be coupled to positive and negative electrical potentials as described above with reference to FIG. 6.

FIGS. 8A-10B illustrate simulation models and results for normal conditions and ground conditions for a conventional shielding configuration and a shielding configuration in accordance with an example of the present disclosure. For the conventional shielding model shown in FIG. 8A, a single shield is connected to a negative electric potential. Vbias= (V1+V2)R/(R+Req1), where R represents three parallel-connected resistors Req1, Rs1 and Rs2. If all leakage resistors have the same value (10 MΩ in this example) and V1+V2=800 VDC, the steady state negative bias Vbias=200 VDC. The noise signal superimposed to the steady state bias adds to the voltage stress between the source and the metal enclosure. Even under normal conditions for the conventional shielding model (FIG. 9A), the source has a negative shift Vbias with respect to chassis. The conventional system is therefore unbalanced even under normal steady state conditions with extremely high parasitic impedance (low leakage current) and increases stress on magnetics assembly. When the conventional shielding model is subjected to a ground fault (FIG. 10A) 400 V is added to the negative bias, exacerbating the stress and leading to potential corona discharge, insulation degradation, and eventual failure of the assembly. In addition, voltage from the positive bus and chassis increased to 850 V peak under a ground fault. The conventional system is therefore under increased voltage stress with repeated ground faults.

A simulation model (FIG. 8B) representing the equivalent circuit of FIG. 2 of the present disclosure includes a noise source and a periodic pulsed ground fault on the negative rail to fully show advantages of the shielding arrangement disclosed herein. Note that the noise source Vnoise1 with capacitive coupling to the source may be realized by any surface where high rate of voltage change is present (e.g. magnetic core). The model includes a split 800 VDC power supply represented by 400 V batteries connected in series, a grounding resistor Rgrnd, a source common-mode filter, a differential mode filter Cin and an output common-mode filter Cfilter. A noise generator Vnoise1 producing 100 V peak and frequency of 20 kHz is coupled to both buses through 10 pF parasitic capacitors and 10 MΩ leakage resistors. It represents an EMI source isolated from the prime power buses (e.g. transformer magnetic core). A transformer parasitic capacitance couples the noise source to the system load represented by resistor Rsystem. A switched pulsed source V5 allows introducing a ground fault at the source side of the system. Under normal conditions (FIG. 9B), both positive and negative buses carry superimposed noise component are balanced with respect to chassis, and the source had zero DC potential to ground. The multiple shield portions can maintain a balanced source, thus reducing stress on the magnetics assembly. Under a ground fault condition at the source (FIG. 10B), the steady state DC voltage potential at the magnetics assembly shifts to −400 V when the ground fault is applied. The voltage stress under a ground fault is reduced to 650 V peak, which is a reduction of the voltage stress under repeated ground faults from the conventional shielding model.

In accordance with one embodiment of the present invention, a method of facilitating suppression of electromagnetic interference (EMI) is disclosed. The method can comprise providing a plurality of shield portions electrically coupled to a positive electric potential polarity or a negative electric potential polarity, wherein at least some of the plurality of shield portions are electrically isolated from one another. Additionally, the method can comprise facilitating electrically coupling at least one of the plurality of shield portions to the positive electric potential and electrically coupling at least one of the plurality of shield portions to the negative electric potential. It is noted that no specific order is required in this method, though generally in one embodiment, these method steps can be carried out sequentially.

In one aspect of the method, all of the plurality of shield portions can be electrically isolated from one another. In another aspect of the method, the plurality of first shield portions can be configured as a polyhedron, such that each of the plurality of first shield portions comprises at least a portion of a face of the polyhedron. In yet another aspect of the method, the plurality of shield portions can comprise a primary group of shield portions and a secondary group of shield portions, wherein at least one of the shield portions of the primary group is electrically coupled to the first positive electric potential polarity and at least one of the shield portions of the primary group is electrically coupled to the first negative electric potential polarity, and wherein at least one of the shield portions of the secondary group is electrically coupled to a second positive electric potential polarity and at least one of the shield portions of the secondary group is electrically coupled to a second negative electric potential polarity.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the foregoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. An electromagnetic interference (EMI) suppressing shield, comprising:
    a plurality of shield portions dispose at least partially about a shielded component the plurality of shield portions being electrically coupled to a positive electric potential polarity or a negative electric potential polarity, wherein at least some of the plurality of shield portions are electrically isolated from one another, and
    wherein at least one of the plurality of shield portions is electrically coupled to the positive electric potential and at least one of the plurality of shield portions is electrically coupled to the negative electric potential.

2. The shield of claim 1, wherein all of the plurality of shield portions are electrically isolated from one another.

3. The shield of claim 1, wherein the plurality of shield portions are configured as a polyhedron, such that each of the plurality of shield portions comprises at least a portion of a face of the polyhedron.

4. The shield of claim 3, wherein the polyhedron comprises a hexahedron.

5. The shield of claim 3, wherein each of the plurality of shield portions corresponds to a face of the polyhedron.

6. The shield of claim 3, wherein at least two of the plurality of shield portions are associated with a single face of the polyhedron.

7. The shield of claim 6, wherein the at least two of the plurality of shield portions are electrically coupled to electric potentials having the same polarity.

8. The shield of claim 3, wherein a first of the plurality of shield portions is electrically coupled to a positive electric potential polarity and corresponds to a first face of the polyhedron and a second of the plurality of shield portions is electrically coupled to a negative electric potential polarity and corresponds to a second face of the polyhedron, and wherein the first face and the second face are opposite one another.

9. The shield of claim 3, wherein at least two of the plurality of shield portions are electrically coupled to one electric potential polarity and correspond to adjacent faces of the polyhedron.

10. The shield of claim 9, wherein at least two of the plurality of shield portions are electrically coupled to the other electric potential polarity and correspond to adjacent faces of the polyhedron.

11. The shield of claim 1, wherein the plurality of shield portions comprises a primary group of shield portions and a secondary group of shield portions, wherein at least one of the shield portions of the primary group is electrically coupled to the first positive electric potential polarity and at least one of the shield portions of the primary group is electrically coupled to the first negative electric potential polarity, and wherein at least one of the shield portions of the secondary group is electrically coupled to a second positive electric potential polarity and at least one of the shield portions of the secondary group is electrically coupled to a second negative electric potential polarity.

12. The shield of claim 1, wherein each of the positive and negative electric potential polarities comprise a plurality of electric potentials.

13. The shield of claim 1, wherein each of the plurality of shield portions comprises at least one of a conductive material and a semi-conductive material.

14. An electromagnetic interference (EMI) suppressing shield system, comprising:
    a first shield having
        a plurality of first shield portions dispose at least partially about a shielded component, the plurality of first shield portions being electrically coupled to a positive electric potential polarity or a negative electric potential polarity, wherein at least some of the plurality of first shield portions are electrically isolated from one another, and
    wherein at least one of the plurality of first shield portions is electrically coupled to the positive electric potential and at least one of the plurality of first shield portions is electrically coupled to the negative electric potential; and
    a second shield electrically coupled to ground.

15. The system of claim 14, wherein all of the plurality of first shield portions are electrically isolated from one another.

16. The system of claim 14, wherein the second shield is disposed about the first shield.

17. The system of claim 14, further comprising a noise source disposed within the first shield.

18. The system of claim 14, wherein the plurality of first shield portions are configured as a polyhedron, such that each of the plurality of first shield portions comprises at least a portion of a face of the polyhedron.

19. The system of claim 14, wherein the plurality of first shield portions comprises a primary group of first shield portions and a secondary group of first shield portions, wherein at least one of the first shield portions of the primary group is electrically coupled to the first positive electric potential polarity and at least one of the first shield portions of the primary group is electrically coupled to the first negative electric potential polarity, and wherein at least one of the first shield portions of the secondary group is electrically coupled to a second positive electric potential polarity and at least one of the first shield portions of the secondary group is electrically coupled to a second negative electric potential polarity.

20. A method of facilitating suppression of electromagnetic interference (EMI), comprising:
   providing a plurality of shield portions dispose at least partially about a shielded component the plurality of shield portions being electrically coupled to a positive electric potential polarity or a negative electric potential polarity, wherein at least some of the plurality of shield portions are electrically isolated from one another; and
   facilitating electrically coupling at least one of the plurality of shield portions to the positive electric potential and electrically coupling at least one of the plurality of shield portions to the negative electric potential.

21. The method of claim 20, wherein all of the plurality of shield portions are electrically isolated from one another.

22. The method of claim 20, wherein the plurality of first shield portions are configured as a polyhedron, such that each of the plurality of first shield portions comprises at least a portion of a face of the polyhedron.

23. The method of claim 20, wherein the plurality of shield portions comprises a primary group of shield portions and a secondary group of shield portions, wherein at least one of the shield portions of the primary group is electrically coupled to the first positive electric potential polarity and at least one of the shield portions of the primary group is electrically coupled to the first negative electric potential polarity, and wherein at least one of the shield portions of the secondary group is electrically coupled to a second positive electric potential polarity and at least one of the shield portions of the secondary group is electrically coupled to a second negative electric potential polarity.

* * * * *